(12) United States Patent
Or-Bach et al.

(10) Patent No.: US 12,093,628 B2
(45) Date of Patent: *Sep. 17, 2024

(54) AUTOMATION METHODS FOR 3D INTEGRATED CIRCUITS AND DEVICES

(71) Applicant: Monolithic 3D Inc., Klamath Falls, OR (US)

(72) Inventors: Zvi Or-Bach, Haifa (IL); Zeev Wurman, Palo Alto, CA (US)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/208,647

(22) Filed: Jun. 12, 2023

(65) Prior Publication Data

US 2023/0325572 A1 Oct. 12, 2023

Related U.S. Application Data

(63) Continuation-in-part of application No. 18/111,567, filed on Feb. 18, 2023, now Pat. No. 11,720,736, which is a continuation-in-part of application No. 18/090,134, filed on Dec. 28, 2022, now Pat. No. 11,615,228, which is a continuation-in-part of application No. 17/953,211, filed on Sep. 26, 2022, now Pat. No. 11,574,109, which is a continuation-in-part of application No. 17/841,619, filed on Jun. 15, 2022, now Pat. No. 11,487,928, which is a continuation-in-part of application No. 17/712,850, filed on Apr. 4, 2022, now Pat. No. 11,514,221, which is a continuation-in-part of (Continued)

(51) Int. Cl.
G06F 30/392 (2020.01)
G06F 30/394 (2020.01)

(52) U.S. Cl.
CPC ......... *G06F 30/392* (2020.01); *G06F 30/394* (2020.01)

(58) Field of Classification Search
CPC .......................... G06F 30/392; G06F 30/394
See application file for complete search history.

(56) References Cited

U.S. PATENT DOCUMENTS

| 6,145,117 A * | 11/2000 | Eng | G06F 30/3947 |
| | | | 716/113 |
| 7,992,122 B1 * | 8/2011 | Burstein | G06F 30/394 |
| | | | 703/19 |
| 8,228,684 B2 * | 7/2012 | Losavio | H01L 25/0657 |
| | | | 361/829 |
| 9,021,414 B1 * | 4/2015 | Or-Bach | G06F 30/394 |
| | | | 716/124 |
| 10,127,344 B2 * | 11/2018 | Or-Bach | G06F 30/394 |
| 11,030,371 B2 * | 6/2021 | Or-Bach | G06F 30/394 |

(Continued)

*Primary Examiner* — Stacy Whitmore
(74) *Attorney, Agent, or Firm* — PatentPC/PowerPatent; Bao Tran

(57) ABSTRACT

A method of designing a 3D Integrated Circuit including: partitioning at least one design into at least two levels, a first level and a second level; levels connection pads between the first level and the second level; providing placement data of the second level; performing a placement of the first level using a placer executed by a computer, where the placement of the first level is based on the placement of the levels connection pads, where the placer is part of a Computer Aided Design (CAD) tool, where the first level includes first routing layers; performing a routing of the first level by routing layers using a router executed by a computer, where the router is a part of the CAD tool or a part of another CAD tool, where at least one metal routing layer is in-between the first level first transistors and the second level second transistors.

20 Claims, 5 Drawing Sheets

Related U.S. Application Data application No. 17/581,884, filed on Jan. 22, 2022, now Pat. No. 11,341,309, which is a continuation-in-part of application No. 17/523,904, filed on Nov. 10, 2021, now Pat. No. 11,270,055, which is a continuation-in-part of application No. 17/385,082, filed on Jul. 26, 2021, now Pat. No. 11,205,034, which is a continuation-in-part of application No. 17/306,948, filed on May 4, 2021, now Pat. No. 11,106,853, which is a continuation-in-part of application No. 16/149,517, filed on Oct. 2, 2018, now Pat. No. 11,030,371, which is a continuation-in-part of application No. 14/672,202, filed on Mar. 29, 2015, now Pat. No. 10,127,344, which is a continuation of application No. 13/862,537, filed on Apr. 15, 2013, now Pat. No. 9,021,414.

(56) References Cited

U.S. PATENT DOCUMENTS

| | | | | |
|---|---|---|---|---|
| 11,106,853 | B1* | 8/2021 | Or-Bach | G06F 30/394 |
| 11,205,034 | B2* | 12/2021 | Or-Bach | G06F 30/394 |
| 11,270,055 | B1* | 3/2022 | Or-Bach | G06F 30/392 |
| 11,341,309 | B1* | 5/2022 | Or-Bach | G06F 30/392 |
| 11,487,928 | B2* | 11/2022 | Or-Bach | G06F 30/392 |
| 11,514,221 | B2* | 11/2022 | Or-Bach | G06F 30/394 |
| 11,574,109 | B1* | 2/2023 | Or-Bach | G06F 30/392 |
| 11,615,228 | B1* | 3/2023 | Or-Bach | G06F 30/392 |
| | | | | 716/128 |
| 11,720,736 | B2* | 8/2023 | Or-Bach | G06F 30/394 |
| | | | | 716/128 |
| 2001/0038612 | A1* | 11/2001 | Vaughn | G06F 30/394 |
| | | | | 370/256 |
| 2019/0384884 | A1* | 12/2019 | Thuries | G06F 30/327 |

\* cited by examiner

AUTOMATION METHODS FOR 3D INTEGRATED CIRCUITS AND DEVICES

CROSS-REFERENCE OF RELATED APPLICATIONS

This application is a continuation-in-part application of U.S. patent application Ser. No. 18/111,567, which was filed on Feb. 18, 2023, which is a continuation-in-part application of U.S. patent application Ser. No. 18/090,134, which was filed on Dec. 28, 2022 (now U.S. Pat. No. 11,615,228 issued on Mar. 28, 2023), which is a continuation-in-part application of U.S. patent application Ser. No. 17/953,211, which was filed on Sep. 26, 2022 (now U.S. Pat. No. 11,574,109 issued on Feb. 7, 2023), which is a continuation-in-part application of U.S. patent application Ser. No. 17/841,619, which was filed on Jun. 15, 2022 (now U.S. Pat. No. 11,487,928 issued on Nov. 1, 2022), which is a continuation-in-part application of U.S. patent application Ser. No. 17/712,850, which was filed on Apr. 4, 2022, (now U.S. Pat. No. 11,514,221 issued on Nov. 29, 2022), which is a continuation-in-part application of U.S. patent application Ser. No. 17/581,884, which was filed on Jan. 22, 2022 (now U.S. Pat. No. 11,341,309 issued on May 24, 2022), which is a continuation-in-part application of U.S. patent application Ser. No. 17/523,904, which was filed on Nov. 10, 2021 (now U.S. Pat. No. 11,270,055 issued on Mar. 8, 2022), which is a continuation-in-part application of U.S. patent application Ser. No. 17/385,082, which was filed on Jul. 26, 2021 (now U.S. Pat. No. 11,205,034 issued on Dec. 21, 2021), which is a continuation-in-part application of U.S. patent application Ser. No. 17/306,948, which was filed on May 4, 2021 (now U.S. Pat. No. 11,106,853 issued on Aug. 31, 2021), which is a continuation-in-part application of U.S. patent application Ser. No. 16/149,517, which was filed on Oct. 2, 2018 (now U.S. Pat. No. 11,030,371 issued on Jun. 8, 2021), which is a continuation-in-part application of U.S. patent application Ser. No. 14/672,202, which was filed on Mar. 29, 2015 (now U.S. Pat. No. 10,127,344 issued on Nov. 13, 2018), which is a continuation application of U.S. patent application Ser. No. 13/862,537, which was filed on Apr. 15, 2013 (now U.S. Pat. No. 9,021,414 issued on Apr. 28, 2015), the entire contents of all of the foregoing are incorporated herein by reference.

BACKGROUND OF THE INVENTION

1. Field of the Invention

This application relates to the general field of computer aided design of monolithic three-dimensional integrated circuits.

2. Discussion of Background Art

Use of computer programs for automating the design of electronic circuits, and particularly for assisting in the design of semiconductor integrated circuits, has been known for at least forty years. This field of Computer-Aided Design (CAD) encompasses the spectrum of engineering activities from early capture of the design idea, through its various refinements (both automatic and manual), modeling, simulations, down to its mapping to physical objects, partitioning and floor-planning, placement and routing, rule-checking and mask-making. The first part of these activities occurs in the logical domain, before mapping to physical objects (macros and cells) occurs, and is known as logic design. The part of the process after mapping the logical design to physical objects is known as physical design.

The rapid shrinking of manufacturable transistor dimensions on semiconductor wafers gave rise to a corresponding explosion of the design sizes that CAD tools need to handle. Modern designs routinely exceed tens and hundreds of millions of transistors and require massive and elaborate CAD tools to handle them.

A typical physical design process is illustrated in FIG. 1. It may start with a netlist 105 made of physical objects, and a set of constraints 110 derived from the logical part of the design flow. Netlist 105 with constraints 110 may be partitioned into a small set of blocks, on the order of 1 to 100 using a program called partitioner 115, which may produce a modified partitioned netlist 135 and modified netlist constraints 140. These, in turn, may be fed into a floor-planner 145 that may arrange these blocks mosaic-like, while respecting design netlist constraints 140, on a rectangular frame that may outline the physical footprint of the final integrated circuit (IC) and produce a newly modified netlist 155 and newly modified design constraints 160. The objects within each floor-planned block of newly modified netlist 155 may then be assigned a location within that block, while respecting newly modified design constraints 160, using the placer 165. Following this step the placed design netlist 175 and modified design constraints 180 may be passed to other CAD tools that may perform routing utilizing router 185, and producing routed netlist 190 that may be passed downstream for rule checking and further processing 195 for the final IC manufacturing. Throughout the CAD process the various CAD tools may use, in addition to the design itself and its constraints, a variety of libraries that describe the netlist objects in their various abstractions, and rules files that define the permissible actions on objects and legal relations between them, and between objects and an abstraction of the underlying technology layers. Further, user intervention may be required at the various steps above.

Traditionally CAD tools operate with the understanding that the underlying transistors are arranged in a single planar layer. In recent years some tools have expanded to consider transistors arranged on multiple stacked layers, where the layers may be connected through relatively large Through-Silicon Vias (TSV) such as described in Xie, Y., Cong, J., Sapatnekar, S. "Three-Dimensional Integrated Circuit Design," Springer, 2010. The focus of this expansion, however, is benefitting from the three-dimensional stacking while minimizing the use of the very large and expensive TSVs.

SUMMARY

The current invention extends CAD tool functionality to operate with a monolithic three-dimensional (3D) manufacturing process. The key difference between a monolithic 3D process and a stacked-layer process where the layers are connected using TSVs is in the size of the inter-layer connection. TSVs are very large relative to advanced lithography feature size, and TSV scaling is not related to lithography but rather to the ability to etch and fill holes at very extreme aspect ratio, and the ability to handle extremely thin wafers. Today best etching and filling aspect ratio is roughly 10:1 and consequently the thinnest wafer that could be properly handled are roughly 50 micron thick with TSV diameter of roughly 5 micron. In contrast inter-layer connections of a monolithic 3D process scales with semiconductor scaling and is already below 100 nm, and will keep on scaling down as the industry continues with dimensional scaling.

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219,005, 9,385,058, 9,406,670, 9,460,978, 9,509,313, 9,640,531, 9,691,760, 9,711,407, 9,721,927, 9,799,761, 9,871,034, 9,953,870, 9,953,994, 10,014,292, 10,014,318, 10,515,981, 10,892,016, 10,991,675, 11,121,121, 11,502, 095, 10,892,016, 11,270,988; and pending U.S. Patent Application Publications and applications, 14/642,724, 15/150,395, 15/173,686, 62/651,722; 62/681,249, 62/713, 345, 62/770,751, 62/952,222, 62/824,288, 63/075,067, 63/091,307, 63/115,000, 63/220,443, 2021/0242189, 2020/ 0013791; and PCT Applications (and Publications): PCT/US2010/052093, PCT/US2011/042071 (WO2012/015550), PCT/US2016/52726 (WO2017053329), PCT/US2017/ 052359 (WO2018/071143), PCT/US2018/016759 (WO2018144957), PCT/US2018/52332(WO 2019/ 060798), PCT/US2021/44110, and PCT/US22/44165. The entire contents of all of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679,977, 10,943,934, 10,998,374, 11,063,071, and 11,133,344. The entire contents of all of the foregoing patents, publications, and applications are incorporated herein by reference.

The implication of the abovementioned difference is that optimization processes of CAD tools for TSV-based processes should focus on minimizing the number of TSVs. In contrast, in monolithic 3D the inter-layer connectivity is much denser and CAD tools should focus on leveraging that large inter-layer connectivity to optimally place objects on different layers based on the layers' potentially disparate characteristics, and to increase the physical proximity of objects in 3D space as compared to a 2D plane. The current invention describes embodiments such as optimizations of CAD tools for monolithic 3D technology.

In one aspect, a method of designing a 3D Integrated Circuit, the method comprising: performing placement using a 2D placer, performing placement for at least a first strata and a second strata, and then performing routing and completing the physical design of said 3D Integrated Circuit.

In another aspect, a method of designing a 3D Integrated Circuit, the method comprising: performing partitioning to at least a first strata and a second strata, then performing placement using a 2D placer, and then performing routing and completing the physical design of said 3D Integrated Circuit.

In another aspect, a method of designing a 3D Integrated Circuit, the method comprising: performing placement using a 2D placer, splitting the placed cells into at least a first group and a second group of similar total area, using said 2D placer to place said second group on a second strata, using said 2D placer to place said first group on a first strata, and then performing routing and completing the physical design of said 3D Integrated Circuit.

In another aspect, a method of designing a 3D Integrated Circuit, the method comprising: performing partitioning to at least a first strata and a second strata; then performing a first placement of said first strata using a 2D placer executed by a computer, wherein said 2D placer is a Computer Aided Design (CAD) tool currently used in the industry for two-dimensional devices; and performing a second placement of said second strata based on said first placement, wherein said partitioning comprises a partition between logic and memory, and wherein said logic comprises at least one decoder representation for said memory.

In another aspect, a method of designing a 3D Integrated Circuit, the method comprising: performing partitioning to at least a first strata and a second strata; then performing a first placement of said first strata using a 2D placer executed by a computer, wherein said 2D placer is a Computer Aided Design (CAD) tool currently used in the industry for two-dimensional devices; and performing a second placement of said second strata based on said first placement, wherein said partitioning comprises a partition between logic and memory, and wherein said logic comprises at least one decoder for said memory.

In another aspect, a method of designing a 3D Integrated Circuit, the method comprising: performing partitioning to at least a first strata and a second strata; then performing a first placement of said first strata using a 2D placer executed by a computer, wherein said 2D placer is a Computer Aided Design (CAD) tool currently used in the industry for two-dimensional devices; and performing a second placement of said second strata based on said first placement, wherein said partitioning comprises splitting a plurality of cells into a high performance group to said first strata and a low performance group to said second strata.

In another aspect, a method of designing a 3D Integrated Circuit, the method comprising: performing partitioning to at least a logic strata comprising logic and a memory strata comprising memory; then performing a first placement of said logic strata using a 2D placer executed by a computer, wherein said 2D placer is a Computer Aided Design (CAD) tool for two-dimensional devices; wherein said 3D Integrated Circuit comprises through silicon vias for connection between said logic strata and said memory strata; and performing a second placement of said memory strata based on said first placement, wherein said logic comprises at least one decoder representation for said memory, wherein said at least one decoder representation has a virtual size with width of contacts for said through silicon vias, and wherein said performing a first placement comprises using said decoder representation instead of an actual memory decoder.

In another aspect, a method of designing a 3D Integrated Circuit, the method comprising: performing partitioning to at least a logic strata comprising logic and a memory strata comprising memory; then performing a first placement of said logic strata using a 2D placer executed by a computer, wherein said 2D placer is a Computer Aided Design (CAD) tool for two-dimensional devices; and performing a second placement of said memory strata based on said first placement, wherein said logic comprises at least one decoder for said memory, and wherein said memory comprises at least a first memory and a second memory, wherein said first memory comprises first memory decoders and said second memory comprises second memory decoders, wherein said 2D placer is set so said second memory decoders are not placed within a rectangle defined by the placement of said first memory decoders.

In another aspect, a method of designing a 3D Integrated Circuit, the method comprising: performing partitioning to at least a logic strata comprising logic and a memory strata comprising memory; then performing a first placement of said logic strata using a 2D placer executed by a computer, wherein said 2D placer is a Computer Aided Design (CAD) tool for two-dimensional devices; and performing a second placement of said memory strata based on said first placement, wherein said partitioning comprises a step of assigning at least one memory block to said logic strata for improved balancing of said logic strata area and said memory strata area.

In another aspect, a method of designing a 3D Integrated Circuit, the method comprising: performing partitioning to at least a logic strata comprising logic and a memory strata comprising memory; then performing a first placement of said logic strata using a 2D placer executed by a computer, wherein said 2D placer is a Computer Aided Design (CAD) tool for two-dimensional devices, wherein said 3D Integrated Circuit comprises through silicon vias for connection between said logic strata and said memory strata; and performing a second placement of said memory strata based on said first placement, wherein said memory comprises a first memory array, wherein said logic comprises a first logic circuit controlling said first memory array, wherein said first placement comprises placement of said first logic circuit, and wherein said second placement comprises placement of said first memory array based on said placement of said first logic circuit.

In another aspect, a method of designing a 3D Integrated Circuit, the method comprising: performing partitioning to at least a logic strata comprising logic and a memory strata comprising memory; then performing a first placement of said logic strata using a 2D placer executed by a computer, wherein said 2D placer is a Computer Aided Design (CAD) tool for two-dimensional devices; and performing a second placement of said memory strata based on said first placement, wherein said logic comprises at least one decoder representation for said memory, and wherein said memory comprises at least a first memory and a second memory, wherein said first memory comprises a first memory decoder representation and said second memory comprises a second memory decoder representation, wherein said 2D placer is set so said second memory decoder representation is not placed within a rectangle defined by placement of said first memory decoder representation.

In another aspect, a method of designing a 3D Integrated Circuit, the method comprising: performing partitioning to at least a logic strata comprising logic and a memory strata comprising memory; then performing a first placement of said logic strata using a 2D placer executed by a computer, wherein said 2D placer is a Computer Aided Design (CAD) tool for two-dimensional devices; and performing a second placement of said memory strata based on said first placement, wherein said partitioning comprises a step of assigning at least one logic block to said memory strata for improved balancing of said logic strata area and said memory strata area.

In another aspect, a method of designing a 3D Integrated Circuit, the method comprising: performing partitioning to at least a logic strata, said logic strata comprising logic, and to a memory strata, said memory strata comprising memory; then performing a first placement of said memory strata using a 2D placer executed by a computer, wherein said 2D placer is a Computer Aided Design (CAD) tool for two-dimensional devices, wherein said 3D Integrated Circuit comprises through silicon vias for connection between said logic strata and said memory strata; and performing a second placement of said logic strata based on said first placement, wherein said memory comprises a first memory array, wherein said logic comprises a first logic circuit controlling said first memory array, wherein said first placement comprises placement of said first memory array, and wherein said second placement comprises placement of said first logic circuit based on said placement of said first memory array.

In another aspect, a method of designing a 3D Integrated Circuit, the method comprising: wherein said 3D Integrated Circuit comprises at least a first strata and a second strata, providing placement data of said first strata; performing a placement of said second strata using a 2D placer executed by a computer, wherein said placement of said second strata is based on said placement data, wherein said 2D placer is a Computer Aided Design (CAD) tool for two-dimensional devices, and wherein said second strata comprises first routing layers; and performing a routing of said second strata routing layers using a 2D router executed by said computer, wherein said 2D router is a Computer Aided Design (CAD) tool for two-dimensional devices.

In another aspect, a method of designing a 3D Integrated Circuit, the method comprising: providing a device design, a first library, and a second library; performing a synthesis step utilizing at least two libraries, wherein said synthesis step results in a first netlist and a second netlist; then performing a first placement of a first strata for said first netlist using a 2D placer executed by a computer, wherein said 2D placer is a Computer Aided Design (CAD) tool for two-dimensional devices; performing a second placement of a second strata for said second netlist using said 2D placer executed by said computer, wherein said 2D placer is a Computer Aided Design (CAD) tool for two-dimensional devices.

In another aspect, a method of designing a 3D Integrated Circuit, the method comprising: performing partitioning to at least a logic strata, said logic strata comprising logic, and to a memory strata, said memory strata comprising memory; then performing a first placement of said memory strata using a 2D placer executed by a computer, wherein said 2D placer is a Computer Aided Design (CAD) tool for two-dimensional devices, wherein said 3D Integrated Circuit comprises a plurality of connections between said logic strata and said memory strata; and performing a second placement of said logic strata based on said first placement, wherein said memory comprises a first memory array, wherein said logic comprises a first logic circuit controlling said first memory array, wherein said first placement comprises placement of said first memory array, and wherein said second placement comprises placement of said first logic circuit based on said placement of said first memory array In another aspect, a method of designing a 3D Integrated Circuit, the method comprising: wherein said 3D Integrated Circuit comprises at least a first strata and a second strata, providing contacts placement data of said first strata; performing a placement of said second strata using a 2D placer executed by a computer, wherein said placement of said second strata is based on said contact placement data, wherein said 2D placer is a Computer Aided Design (CAD) tool for two-dimensional devices, and wherein said second strata comprises first routing layers; and performing a routing of said second strata routing layers using a 2D router executed by said computer, wherein said 2D router is a Computer Aided Design (CAD) tool for two-dimensional devices.

In another aspect, a method of designing a 3D Integrated Circuit, the method comprising: providing a device design, a first library, and a second library; performing a synthesis step utilizing at least two libraries, wherein said synthesis step results in a first netlist and a second netlist; then performing a first placement of a first strata for said first netlist using a 2D placer executed by a computer; and performing a second placement of a second strata for said second netlist using a 2D placer executed by said computer or by another computer.

In another aspect, a method of designing a 3D Integrated Circuit, the method including: partitioning at least one design into at least two levels, a first and a second level, where the first level includes logic and the second level includes memory; then performing a first placement of the second level using a placer executed by a computer, where the placer is a part of a Computer Aided Design (CAD) tool, where the 3D Integrated Circuit includes a plurality of connections between the first level and the second level; and performing a second placement of the first level based on the first placement, where the memory includes a first memory array, where the logic includes a first logic circuit configured so as to write data to the first memory array, where performing the first placement includes placing the first memory array, and where performing the second placement includes placing the first logic circuit based on the first placement of the first memory array.

In another aspect, a method of designing a 3D Integrated Circuit, the method including: providing at least a first level and a second level; providing contact placement data of the first level; performing a placement of the second level using a placer executed by a computer, where the placement of the second level is based on the contact placement data, where the placer is part of a Computer Aided Design (CAD) tool, and where the second level includes first routing layers; and performing a routing of the second level routing layers using a router executed by the computer, where the router is a part of the Computer Aided Design (CAD) tool or a part of another CAD tool.

In another aspect, a method of designing a 3D Integrated Circuit, the method including: providing a device design, and a library including first library cells and second library cells; performing a synthesis step utilizing the library, where the performing a synthesis step includes execution by a computer or by another computer, where the synthesis step results in a first netlist including first library cells and a second netlist including second library cells; then performing a first placement of the first netlist on a first level using a placer; and performing a second placement of the second netlist on a second level using the placer, where the placer is executed by the computer or by another computer.

In another aspect, a method of designing a 3D Integrated Circuit, the method including: partitioning at least one design into at least two levels, a first and a second level, where the first level includes logic and the second level includes memory; and then receiving a first placement of at least portion of the second level, where the first placement includes a placement of a first memory array, where the 3D Integrated Circuit includes a plurality of connections between the first level and the second level; and performing a second placement of the first level based on the first placement, where the performing a second placement includes using a placer executed by a computer, where the placer is a part of a Computer Aided Design (CAD) tool, where the logic includes a first logic circuit configured so as to write data to the first memory array, and where performing the second placement includes placing the first logic circuit based on the first placement of the first memory array.

In another aspect, a method of designing a 3D Integrated Circuit, the method including: partitioning at least one design into at least two levels, a first and a second level, where the first level includes logic and the second level includes memory, where the 3D Integrated Circuit includes a plurality of connections between the first level and the second level; and then receiving a first placement of at least portion of the plurality of connections, where the 3D Integrated Circuit includes a plurality of connections between the first level and the second level; and performing a second placement of the first level based on the first placement, where the performing a second placement includes using a placer executed by a computer, where the placer is a part of a Computer Aided Design (CAD) tool; and performing a third placement of the second level based on the first placement, where the third placement includes a placement of a first memory array, where the logic includes a first logic circuit configured so as to write data to the first memory array.

In another aspect, a method of designing a 3D Integrated Circuit, the method including: partitioning at least one design into at least two levels, a first and a second level, where the first level includes logic and the second level includes memory; and then receiving a first placement of at least portion of the second level, where the first placement includes a placement of a first memory array and a second memory array, where the 3D Integrated Circuit includes a plurality of connections between the first level and the second level; and performing a second placement of the first level based on the first placement, where the performing a second placement include using a placer executed by a computer, where the placer is a part of a Computer Aided Design (CAD) tool, where the logic includes a first logic circuit configured so as to write data to the first memory array, and where performing the second placement includes placing the first logic circuit based on the first placement of the first memory array.

In another aspect, a method of designing a 3D Integrated Circuit, the method including: partitioning at least one design into at least two levels, a first level and a second level, wherein said first level comprises logic and said second level comprises memory; and then obtaining a first placement of at least portion of said second level, wherein said first placement comprises a placement of a first memory array, wherein said 3D Integrated Circuit comprises a plurality of connections between said first level and said second level; and performing a second placement, wherein performing said second placement comprises placing said first logic circuit based on said first placement of said first memory array, wherein said performing a second placement comprises using a placer executed by a computer, wherein said placer is a part of a Computer Aided Design (CAD) tool, and wherein said logic comprises a first logic circuit configured to read data from said first memory array In another aspect, a method of designing a 3D Integrated Circuit, the method including: partitioning at least one design into at least two levels, a first level and a second level, wherein said first level comprises logic and said second level comprises memory, wherein said 3D Integrated Circuit comprises a plurality of connections between said first level and said second level; and then obtaining a first placement of at least portion of said plurality of connections, performing a second placement of said first level based on said first placement, wherein said performing a second placement comprises using a placer executed by a computer, wherein said placer is a part of a Computer Aided Design (CAD) tool; wherein said logic comprises a first logic circuit configured to read data from said first memory array.

In another aspect, a method of designing a 3D Integrated Circuit, the method including: partitioning at least one design into at least two levels, a first level and a second level, wherein said first level comprises logic and said second level comprises memory; and then obtaining a first placement of at least a portion of said second level, wherein said first placement comprises a placement of a first memory array and a second memory array, wherein said 3D Integrated Circuit comprises a plurality of connections between said first level and said second level; and performing a second placement of said first level based on said first placement, wherein said performing a second placement comprises using a placer executed by a computer, wherein said placer is a part of a Computer Aided Design (CAD) tool, wherein said logic comprises a first logic circuit configured to read data from said first memory array, and wherein performing said second placement comprises placing said first logic circuit based on said first placement of said first memory array.

In another aspect, a method of designing a 3D Integrated Circuit, the method including: partitioning at least one design into at least two levels, a first level and a second level; providing connections placement data of said second level, wherein said connections comprise planned connections between said first level and said second level; performing a placement of said first level using a placer executed by a computer, wherein said placement of said first level is based on said connections placement data, wherein said placer is part of a Computer Aided Design (CAD) tool, and wherein said first level comprises first routing layers; and performing a routing of said first level by routing layers using a router executed by a computer, wherein said router is a part of the Computer Aided Design (CAD) tool or a part of another CAD tool.

In another aspect, a method of designing a 3D Integrated Circuit, the method including: partitioning at least one design into at least two levels, a first level and a second level; providing connections placement data of said second level, wherein said connections comprise planned connections between said first level and said second level; performing a placement of said first level using a placer executed by a computer, wherein said placement of said first level is based on said connections placement data, wherein said placer is part of a Computer Aided Design (CAD) tool, and wherein said first level comprises first routing layers; and performing a routing of said first level by routing layers using a router executed by a computer, wherein said router is a part of the Computer Aided Design (CAD) tool or a part of another CAD tool, and wherein a majority area of said second level comprises memory circuits.

In another aspect, a method of designing a 3D Integrated Circuit, the method including: partitioning at least one design into at least two levels, a first level and a second level; providing connections placement data of said second level, wherein said connections comprise planned connections between said first level and said second level; performing a placement of said first level using a placer executed by a computer, wherein said placement of said first level is based on said connections placement data, wherein said placer is part of a Computer Aided Design (CAD) tool, and wherein said first level comprises first routing layers; and performing a routing of said first level routing layers using a router executed by a computer, wherein said router is a part of the Computer Aided Design (CAD) tool or a part of another CAD tool, and wherein a majority area of said second level comprises non-logic circuits such as memory circuits or Radio Frequency ("RF") circuits or analog circuits.

In another aspect, a method of designing a 3D Integrated Circuit, the method including: partitioning at least one design into at least two levels, a first level and a second level; providing placement data of the second level; performing a placement of the first level using a placer executed by a computer, where the placement of the first level is based on the placement data, where the placer is part of a Computer Aided Design (CAD) tool, and where the first level includes first routing layers; and performing a routing of the first level by routing layers using a router executed by a computer, where the router is a part of the Computer Aided Design (CAD) tool or a part of another CAD tool.

In another aspect, a method of designing a 3D Integrated Circuit, the method including: partitioning at least one design into at least two levels, a first level and a second level, where a majority area of the first level includes logic circuits, and where a substantial area of the second level includes analog circuits; providing connections placement data of the second level, where the connections include planned connections between the first level and the second level; performing a placement of the first level using a placer executed by a computer, where the placer is part of a Computer Aided Design (CAD) tool, and where the first level includes first routing layers; and performing a routing of the first level by routing layers using a router executed by a computer, where the router is a part of the Computer Aided Design (CAD) tool or a part of another CAD tool.

In another aspect, a method of designing a 3D Integrated Circuit, the method including: partitioning at least one design into at least two levels, a first level and a second level; providing connections placement data of the second level, where the connections include planned connections between the first level and the second level; performing a placement of the first level using a placer executed by a computer, where the placer is part of a Computer Aided Design (CAD) tool, and where the first level includes first routing layers; and performing a routing of the first level routing layers using a router executed by a computer, where the router is a part of the Computer Aided Design (CAD) tool or a part of another CAD tool, where the second level includes circuits designed for non-advanced process nodes, and where the first level includes circuits designed for an advanced process node.

In another aspect, a method of designing a 3D Integrated Circuit, the method including: partitioning at least one design into at least two levels, a first level and a second level, where the first level includes a plurality of first transistors, where the second level includes a plurality of second transistors, and where the second level is disposed on top of the first level; levels connection pads between the first level and the second level; providing placement data of the second level; performing placement of the levels connection pads based on the placement data, performing a placement of the first level using a placer program executed by a computer, where the placement of the first level is based on the placement of the levels connection pads, where the placer is part of a Computer Aided Design (CAD) tool, and where the first level includes first routing layers; and performing a routing of the first level by routing layers using a router executed by a computer, where the router is a part of the Computer Aided Design (CAD) tool or a part of another CAD tool, and where at least one metal routing layer is disposed in-between the plurality of first transistors and the plurality of second transistors.

In another aspect, a method of designing a 3D Integrated Circuit, the method including: partitioning at least one design into at least two levels, a first level and a second level, where the first level includes a plurality of first transistors, where the second level includes a plurality of second transistors, where the second level is disposed on top of the first level, where a majority area of the first level includes logic circuits, and where a substantial area of the second level includes analog circuits; providing connections placement data of the second level, where the connections include planned connections between the first level and the second level; performing a placement of the first level using a placer program executed by a computer, where the placer is part of a Computer Aided Design (CAD) tool, and where the first level includes first routing layers; and performing a routing of the first level by routing layers using a router executed by a computer, where the router is a part of the Computer Aided Design (CAD) tool or a part of another CAD tool.

In another aspect, a method of designing a 3D Integrated Circuit, the method including: partitioning at least one design into at least two levels, a first level and a second level, where the first level includes a plurality of first transistors, where the second level includes a plurality of second transistors, where the second level is disposed on top of the first level; providing connections placement data of the second level, where the connections include planned connections between the first level and the second level; performing a placement of the first level using a placer program executed by a computer, where the placer is part of a Computer Aided Design (CAD) tool, and where the first level includes first routing layers; and performing a routing of the first routing layers using a router executed by a computer, where the router is a part of the Computer Aided Design (CAD) tool or a part of another CAD tool, where the second level includes circuits designed for non-advanced process nodes, and where the first level includes circuits designed for an advanced process node.

BRIEF DESCRIPTION OF THE DRAWINGS

Various embodiments of the invention will be understood and appreciated more fully from the following detailed description, taken in conjunction with the drawings in which.

DETAILED DESCRIPTION

Figure 1:
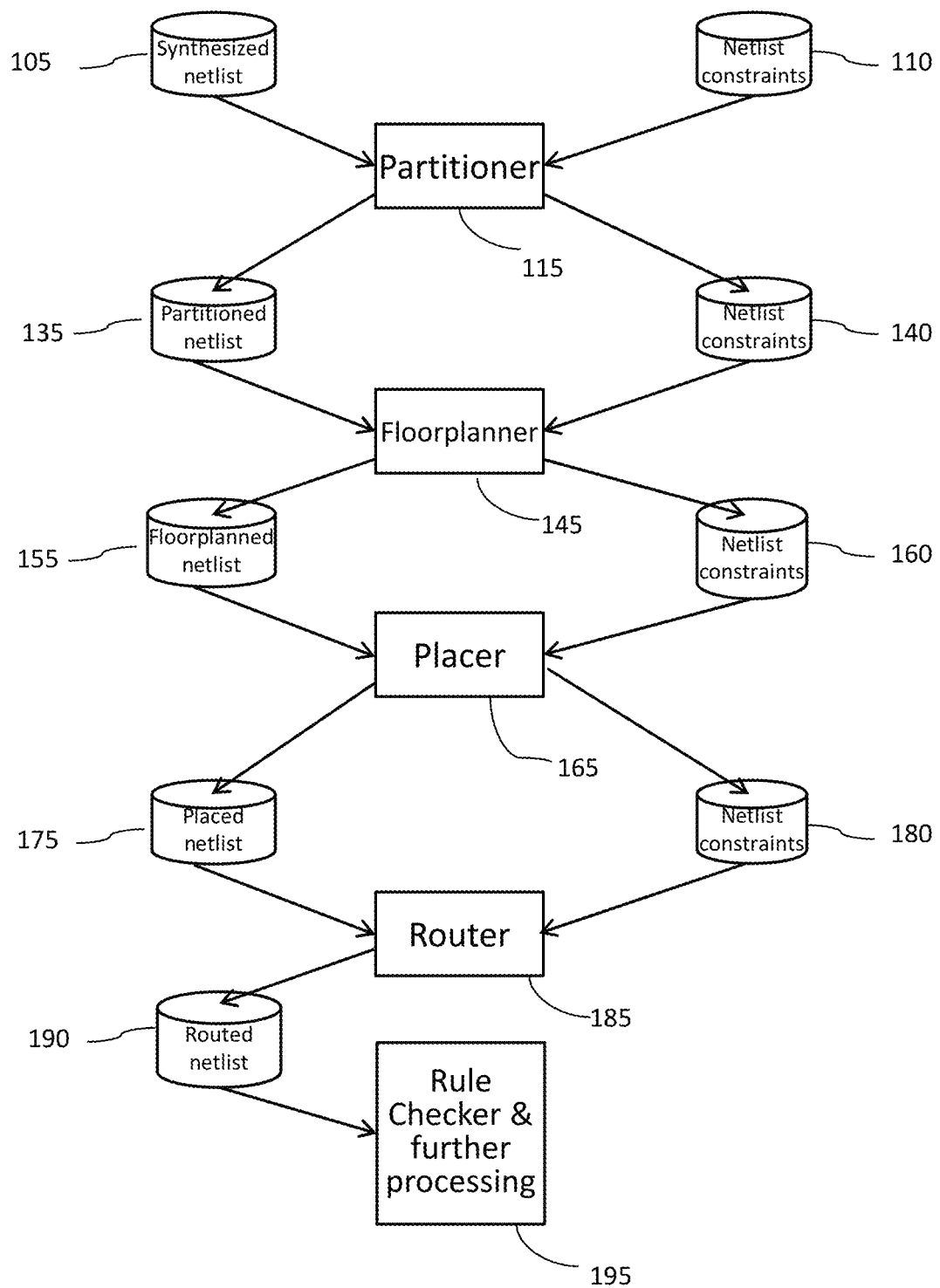
FIG. 1 is an exemplary drawing illustration of a typical CAD design flow.

Embodiments of the present invention are described herein with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

There are multiple known ways to partition a design, but the essential approach described in Metis (Karypis, G., Kumar, V., "METIS—Unstructured Graph Partitioning and Sparse Matrix Ordering," 1995) subsumes most of them in modern CAD tools. It may consist of three phases: graph coarsening through clustering, followed by partitioning of the smaller resulting graph, followed by an uncoarsening phase. Most partitioners will include additional design constraints, such as timing slack of nets, in the optimization costs during the coarsening and uncoarsening phases, in addition to minimizing the number of nets crossing the partition boundary (the cut). The current invention suggests including disparate technology characteristics as an additional constraint to optimize.

More specifically, different active logic layers in a stacked monolithic 3D IC can differ in their lithography feature sizes, the more aggressive ones being faster but more expensive to manufacture. In a 3D IC device every stratum may be fabricated in its own process with, for example, its own set of design rules, unlike 2D IC wherein all transistors exist on the same stratum and will be processed together with the same process. Accordingly the 3D IC partitioning of device circuits to individual strata could be based on which types of circuits would be efficient to process together. Such decision could be based on a criterion, for example, such as the type of lithography requirements. In a modern IC the cost of lithography dominates the end-device cost. Consequently it may be effective to maximize the number of strata that utilize lower cost lithography processes and minimizing the number of strata that might require the most aggressive and expensive lithography, for example, containing high speed circuits. Yet other strata may include repetitive memory circuits that might use a spacer-based lithography scheme which may lower costs even further. The slower logic of a device circuit might be partitioned to use older process node circuits with much lower cost lithography. Yet other strata could be dedicated to I/O circuits that might also use lower cost lithography. Strata can differ in their number of metal routing layers, the larger number of such offering more connectivity and hence denser area utilization, albeit at a higher manufacturing cost. Strata can differ in the power dissipation and leakage of the transistors, for example, lower power consumption portions may be grouped on a strata and/or slower speed of operation portions, and/or lower leakage portions. Such differences can be translated into a "cost" of the cut under optimization and create new dimensions of optimization of monolithic 3D structures. Strata can differ in the process design rules utilized to form the devices and circuits in each stratum, for example, a first stratum may have a set of design rules that is one or more process nodes more advanced than a second stratum set of design rules.

An additional embodiment of the invention is the partitioning of memories into different memory layers in a stacked monolithic 3D IC. For example, the layers can differ by their suitability to types of memory they can implement, such as volatile versus non-volatile, or dynamic versus static. In this case the affinity of the memory type used in the design to the available memory layer characteristics may be translated into either a hard affinity attribute (if the object must be placed on a given layer type) or into a "cost" attribute and may be included in the partitioner. Hard affinity attributes may force the partitioner to cluster only objects with compatible attributes.

An additional embodiment of the invention is partitioning between various analog functions, including input and output functions, and the rest of the logic and memory of the design, where the analog elements may be mapped onto one or more potentially disparate analog layers in a stacked monolithic 3D IC. The analog layers can vary in their lithography processes, or in their semiconductor material bases such as Silicon, Germanium, or composite III-V semiconductors, for example, Gallium-Arsenide or Indium-Phosphide. Similar to the case of memory described above, the affinity of the analog object type used in the design to the available analog layer characteristics may be translated either into a hard affinity or into a "cost" function and may be included in the partitioner. As before, hard affinity attributes may force the partitioner to cluster only objects with compatible attributes.

Another criterion for partition could be the thickness of the silicon layer. For high speed logic it might be desirable to use fully depleted transistors, such as, for example, FinFet or planar fully depleted SOI transistors, that may require a relatively thin silicon layer, for example, as thin as 25 nm, 10 nm or 5 nm. I/O (Input/Output), Analog, high voltage circuits such as charge pumps, and RF (Radio Frequency) circuits might benefit from a thicker semiconductor material base in that strata, for example mono-crystalline silicon of for example 50 nm, 100 nm or 200 nm , and accordingly it might be preferred to have those circuits on different strata than the fully depleted devices and circuits.

An additional embodiment of the invention is partitioning a design that includes a feasible combination of objects described previously. More specifically, partitioning of designs may include a combination of logic elements, memory elements, and analog elements, into multiple layers of disparate characteristics of each kind.

An additional embodiment of the invention includes partitioning of a memory block into its core bit-cell array that is targeted for a memory layer, and some or all of its decoding and driving logic that is targeted for a logic layer. It is the rich vertical connectivity available in a monolithic 3D process that allows such partitioning to be considered in the partitioner.

An additional embodiment of the invention includes partitioning of a design into elements that span a single layer versus those that span multiple adjacent vertical layers. Similar to other specialized partitions, this characteristic can be translated into a "cost" or it can be used to drive a hard partitioning in the partitioner. Further, if both multi-layer and single-layer variants of an object are present, the partitioner can select the best-fitting variant based on global design considerations together with the overall system cost.

Figure 2:
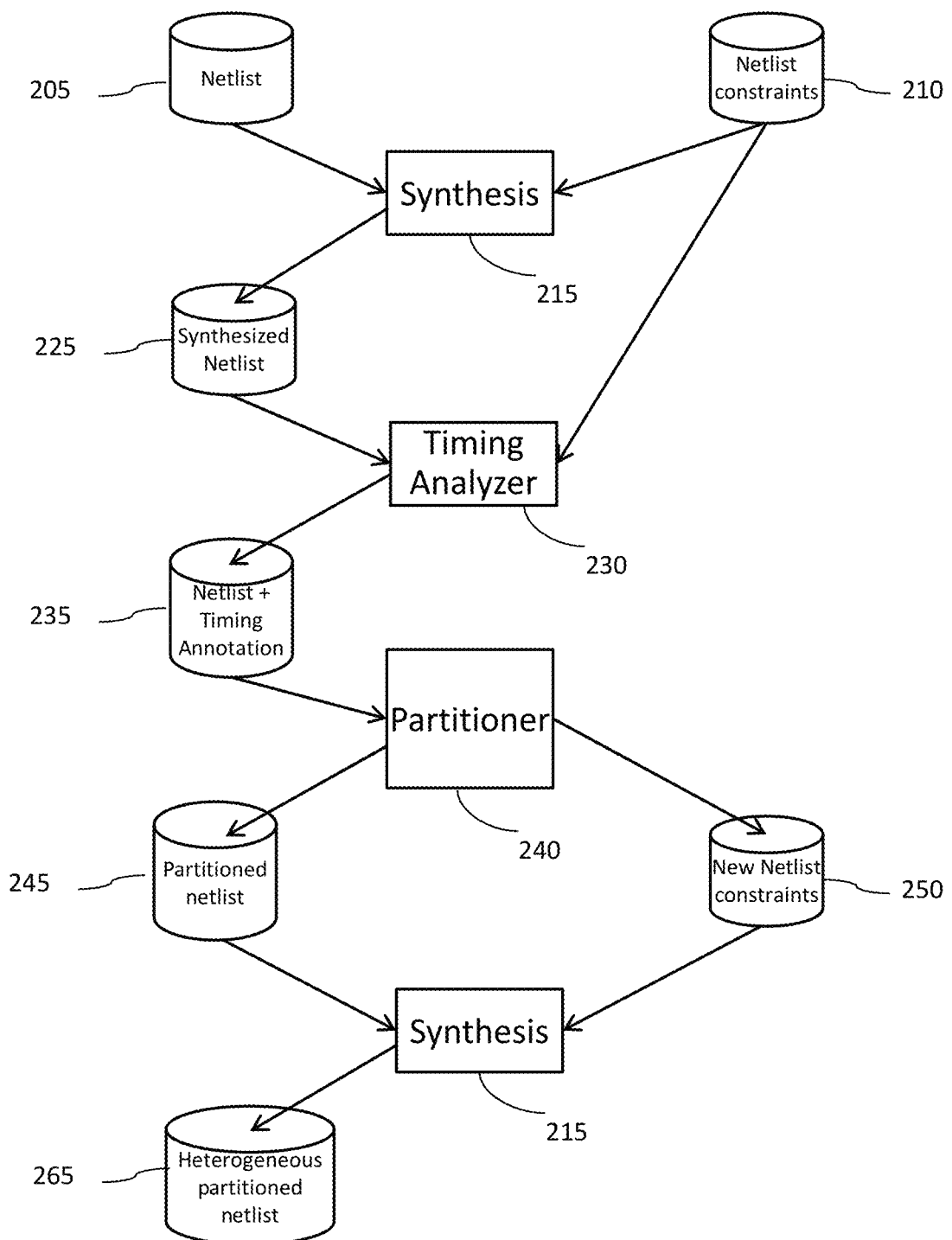
FIG. 2 is an exemplary drawing illustration of a flowchart to use layer attributes during a coarsening or un-coarsening stages of partitioning.

FIG. 2 is a drawing illustration of an exemplary flow implementing additional constraints such as those described above into the partitioner. Design netlist 205 with its design constraints 210 may be synthesized with a synthesis program 215 producing synthesized netlist 225. Timing analysis 230 may be performed on the synthesized netlist 225 and a timing slack—the difference between the expected clock cycle and the intrinsic delay of the object in the path—may be annotated on each net thereby producing the annotated netlist 235. During the timing analysis, estimates of net delays may be added based on a variety of considerations such as, for example, fanout and/or floorplan information. Timing slack, the difference between its budgeted time and its estimated time delay, may be computed for each net. The larger the timing slack, the less critical is the net and the objects at its beginning and end. A partitioner 240 may then partition annotated netlist 235 into partitioned netlist 245, producing new netlist constraints 250. The newly partitioned netlist 245 may now be remapped using synthesis program 215 with each partition targeted at an appropriate, and potentially different, technology producing the final heterogeneous partitioned netlist 265. Synthesizing partitions to a slower and less expensive (or less power hungry) technology based on the amount of timing slack may allow for cost optimization. In contrast, objects with incompatible hard affinity attributes are generally not clustered together during the coarsening and uncoarsening phases and consequently may likely end up in homogenous partitions. Two or more libraries may be utilized for synthesis program 215.

The partitioned design will typically be followed by a floor planning stage and afterward, the design will typically move to a placement step, wherein the objects within each floor-planned block will be assigned a location within that block's boundary.

Of unique concern during the 3D floor-planning and the placement stage may be instances where the core bit-cell array of a memory block has been separated from its decoding and driving logic, the former being placed on a memory layer and the latter on a logic layer. In particular, the floor-planning of these blocks should allow for sufficient direct vertical overlap so that a symmetrical arrangement of vertical connections between the two parts of the memory block can be guaranteed. Further, the placer may use this overlap to place both parts of the memory block centered one above the other to achieve maximal symmetry. This is to facilitate relative uniformity of delays that such interconnect typically requires.

Figure 3:
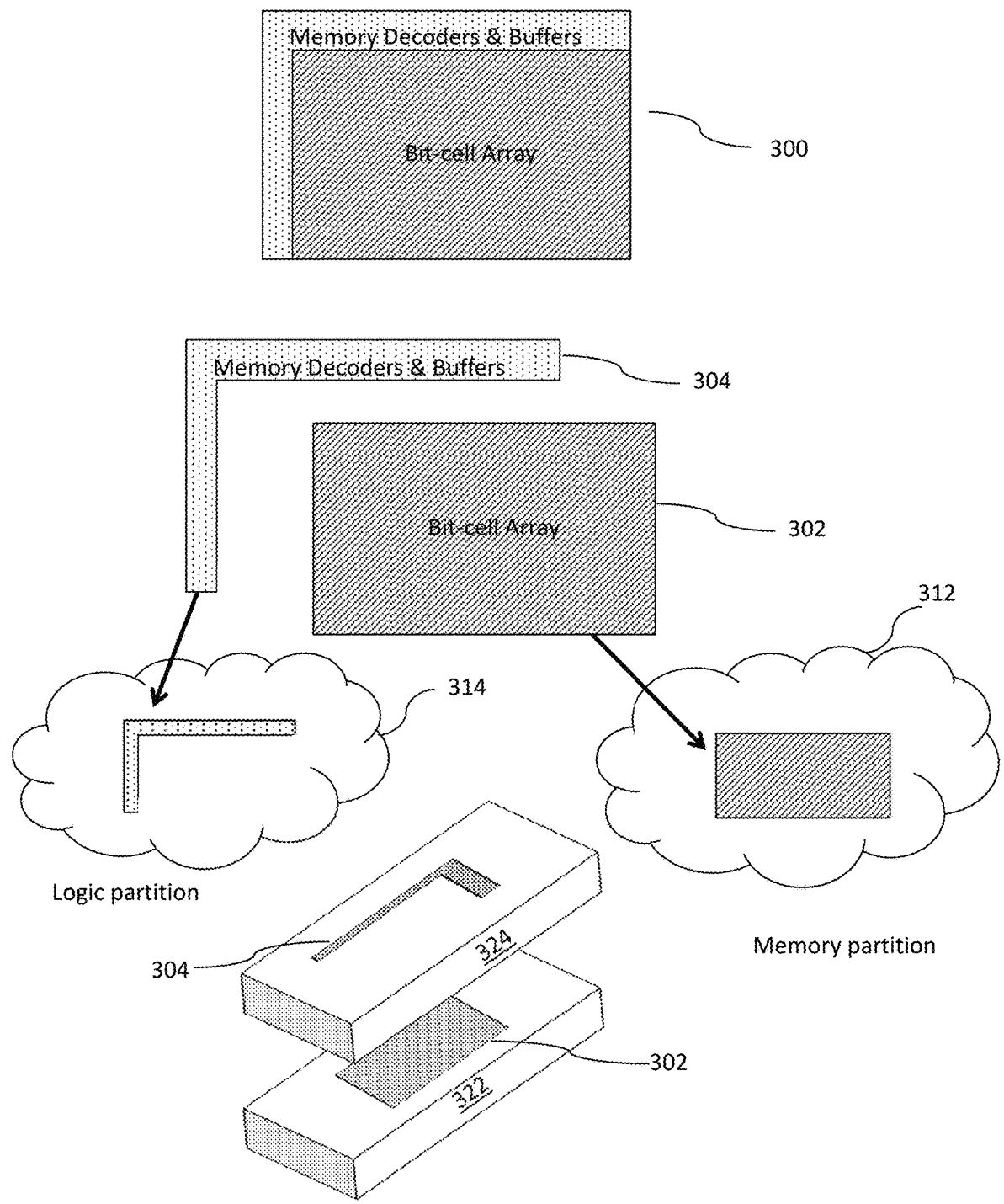
FIG. 3 is an exemplary drawing illustration of placement of a memory block split into core bit-cell array and its decoding and driving logic.

FIG. 3 is a drawing illustration describing the process of working with a split memory block. Memory block 300 may be split into core bit-cell array 302 and memory decoder/drivers 304. Each of those two components may end up in a different partition after a partitioning step: the core bit-cell array 302 in memory partition 312, and the memory decoder/drivers 304 in logic partition 314. The floor-planner may place memory partition 312 and logic partition 314 on two different strata layers, layer one 322 and layer two 324, according to partition attributes, and makes sure that their (core bit-cell array 302 and memory decoder/drivers 304) footprints overlap vertically in a proper orientation. After floor-planning, the placer may place the core bit-cell array 302 on layer one 322 and the memory decoders/drivers 304 on layer two 324 with a common radial symmetry to facilitate uniform timing to the core bit-cell array 302.

Persons of ordinary skill in the art will appreciate that the illustrations in FIGS. 2 and 3 are exemplary only and are not drawn to scale. Such skilled persons will further appreciate that many variations may be possible such as, for example, in some cases it might be preferred to have the memory decoders in the logic stratum and to have the bit-cells in the memory stratum. Many other modifications within the scope of the illustrated embodiments of the invention described herein will suggest themselves to such skilled persons after reading this specification. Thus the invention is to be limited only by the appended claims.

An additional advantage of partitioning based on manufacturing consideration is that with proper set up and support utilities, existing 2D Place & Route design tools could be used for 3D IC design as outlined in the following sections.

Figure 4:
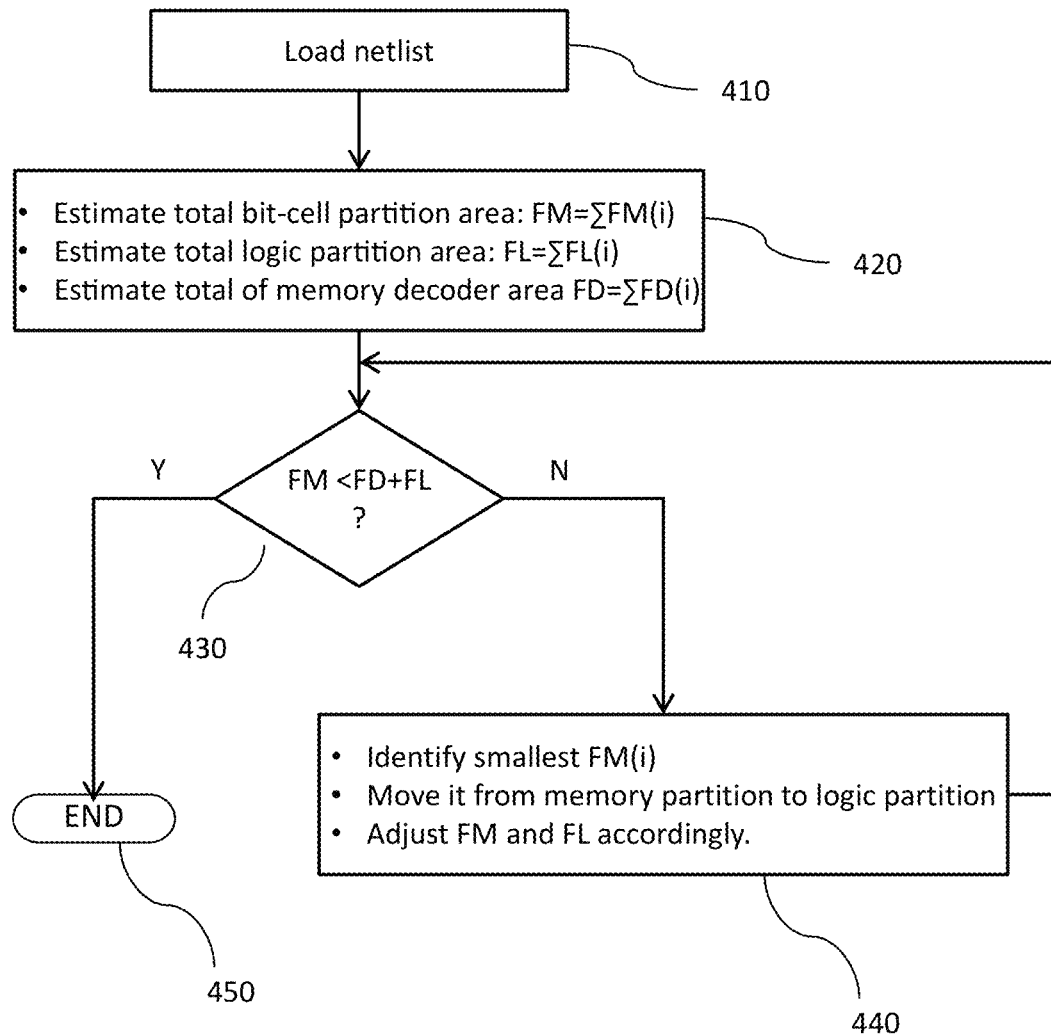
FIG. 4 is an exemplary drawing illustration of a flow diagram to balance the two strata.

FIG. 4 illustrates a flow diagram to balance the two strata in case that the required area for the bit-cells is larger than the area required for the logic and the memory decoders. In such case an option may exist to transfer the smaller memories from one stratum to another stratum until the area for the two strata had been balanced. After loading netlist 410 and estimating the total area of memory partition (FM) and of logic partition made of logic (FL) and memory decoders (FD) in step 420, the flow systematically transfers the smallest memory blocks from the memory partition to the logic partition and adjusts the estimated costs 440. Once the memory partition has sufficiently shrunk and its estimated size is smaller than that of the logic partition 430, the process terminates 450.

If the area required for the bit-cells is far smaller than the area for logic and the memory decoders, then a similar algorithm can offer the choice to selectively add memory decoders, or other compatible, typically analog, circuitry to the memory stratum to better balance the utilization of the two strata. In such case, however, both strata will need to support both memory and logic and the advantage of tuning the memory stratum process and design to memory only will be mostly negated.

Typically the memory used in designs is assumed to be a static RAM ("SRAM") with each SRAM cell made of more than one, for example six, or even eight, transistors. In a 3D IC environment it could be feasible to use a one transistor memory cell instead. For example, the use of a DRAM cell might be possible with the memory stratum optimized accordingly to DRAM process and design, and may use either a stack capacitor or a trench capacitor based memory cell, typically stack capacitors if it is a top stratum or trench capacitors if it is the bottom stratum. Other types of memories could also be considered, such as, for example, Spin-Transfer Torque RAM (STT-RAM) or Zeno Semiconductor's floating body RAM with two stable states. Having a stratum dedicated to memory bit-cells makes it easier to use a special memory process flow that may be required for such stratum.

Once the allocation of structures to the bit-cells strata and the logic and memory decoder strata has been done, the next step is to place and route each strata and the connection between them.

This could be done using 2D tools in the following exemplary manner. First, the memory decoders may be introduced to the Placer as specialized L-shaped cells such that other logic, but no other memory decoder, is allowed in the empty space in the rectangle defined by its L-shape.

In the next step the 2D Placer may perform the placement on the logic stratum.

Then the bit-cell arrays may be placed in the memory stratum according to the placement of their respective memory decoders on the logic stratum.

Finally, the logic stratum may be routed, with the vertical connections between memory decoders and their bit-cell arrays occurring automatically as a part of the strata abutment.

If the utilization of memory stratum is low, non-memory circuitry may be added to that memory stratum that shares some of its characteristics. Examples of such are input and output cells ("IO") and analog functions such as Phase Lock Loop ("PLL").

The place and route flow could be similar to the one above. First a 2D-Placer could be used to place the logic stratum, then the bit-cell arrays may be placed on the memory stratum according to the placement of their respective memory decoders, and then a 2D-Placer could be used to place the other elements in the memory stratum. In such case the inter-strata nets are defined as virtual IOs for each stratum 2D place and route process.

The location of such inter-strata net virtual IO point can be defined as a location as directly as possible above or below, depending on the direction of the inter-strata crossing, of the source terminal of the inter-strata net. Another possible option is for this virtual IO be defined in the proximity, above or below as necessary, of the center-of-gravity of the inter-strata net on the stratum that is placed first.

When the bit-cell area is too small, the decoders may be placed at the bit-cell strata. This could be done also to reduce the number of connections between the strata as the decoder function is to expand the address from n lines of address lines to twice $2^{**}(n/2)$ lines memory select lines. A simple option is to use a similar flow as has been presented before but represent the decoders not with the actual layout size but with virtual size with width of contacts for Through Layer Vias. But keep the keep out zone for other decoders the same as before. In this way the 2D Placer can place the logic cell properly for the logic strata, and the memory strata which could include the bit-cells and the decoder would be defined according to the placed logic strata.

Another type of partition to two strata could be between high speed logic and low power logic or alternatively lower speed logic using older process node.

In both cases a 2D-Placer could be used first to place the high speed logic, and then place the other, low power or lower speed logic, stratum with a 2D Placer using the placement of the high speed stratum to drive the placement on the second stratum similar to the flow described above.

Additional advantage of the 3D IC technology is in its ease of use for a platform-based design. One or more strata could be designed, and even pre-manufactured, as a platform for multiple applications with platform's connections brought up to the top routing layer. Then, additional strata can be designed and customized for each application and placed on top of the pre-designed platform. In such process the platform strata would first be placed and routed using the 2D Placer and Router as described previously. Then the custom stratum could be placed and routed using a 2D Placer and Router with connections to the predefined contacts on the top level of the underlying platform design.

A 2D Placer could be used also for multiple strata placement of cells that are not partitioned first by some of the methods presented here. One option is to use a 2D partitioner such as Metis to partition the design into K partitions, each corresponding to one of K strata.

Figure 5:
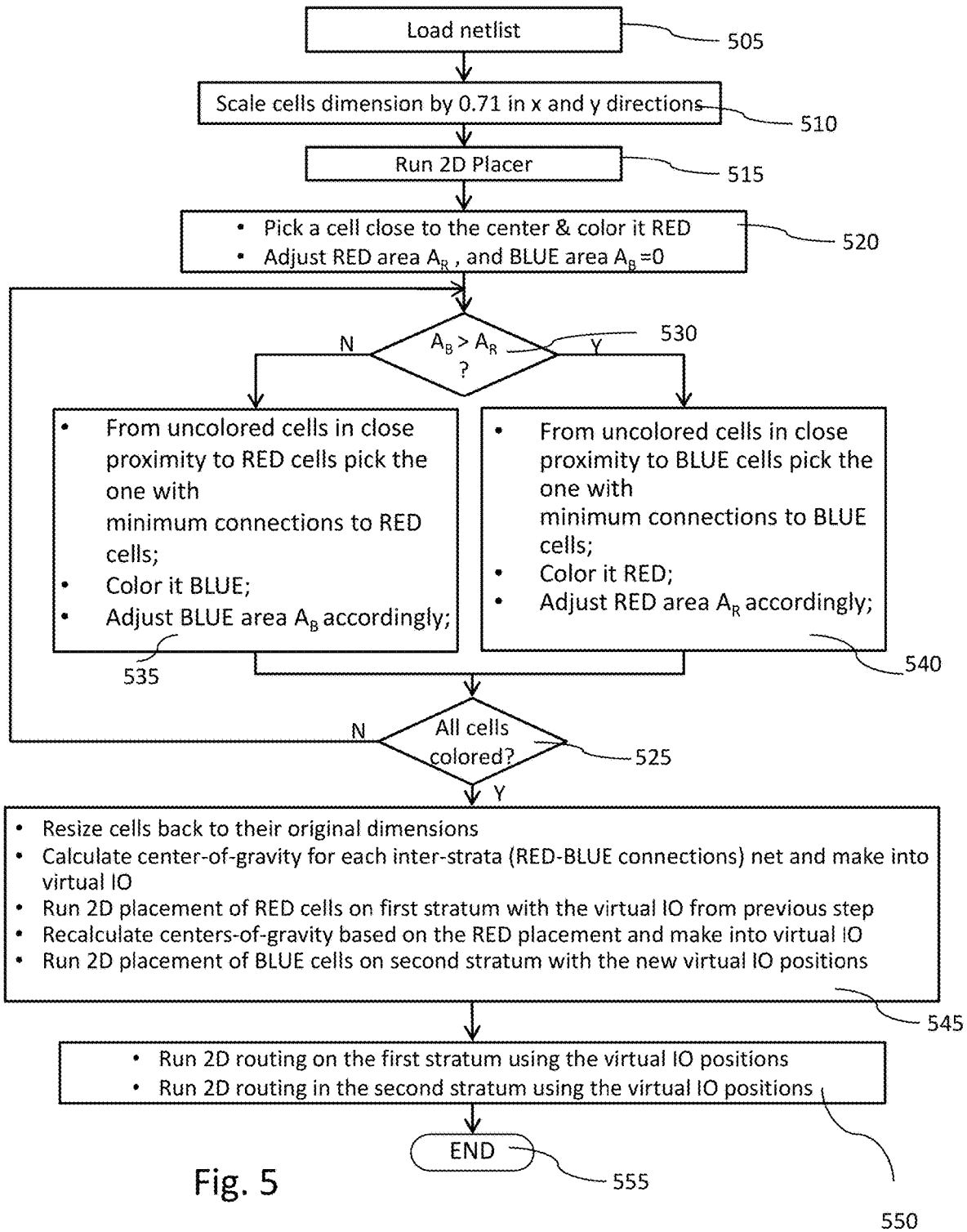
FIG. 5 is an exemplary drawing illustration of a flow using a 2D Placer for placing a netlist on two or more strata.

FIG. 5 illustrates a flow using a 2D Placer for placing a netlist on two strata. A similar flow could be used for three or more strata.

After loading the netlist 505 and resizing the dimensions of the cells by 0.71 in each direction 510, a 2D placement 515 is performed. A seed for the placement is picked from the center of the design and assigned to the first (red) partition 520. Based on the relative size of both partitions 530 the next cell is added to either the first (red) or the second (blue) partition. When the blue partition is smaller, between the cells that are currently placed in a close proximity to a Red Cell select the one with minimum connection to the red partition and add it to the blue partition 535. Similarly, when the red partition is smaller, between the cells that are currently placed in a close proximity to a Blue Cell select the one with minimum connection to the red partition and add it to the red partition 540. Once the process leaves no unassigned cells 525 it moves to the next step 545. Centers-of-gravity ("COG") of all inter-strata nets are calculated based on the original 2D placement 515 and used to create virtual IOs crossing the strata boundary at that location. Library cells are restored to their original sizes and 2D placement is performed on the first stratum with the first partition. The COGs (and virtual IOs) are adjusted based on the new placement, and the second partition placed in 2D on the second stratum. Optionally the COG and virtual IOs are readjusted again based on the final placement of both strata, and a 2D router is run on each stratum separately 550, after which the place and route process terminates 555 and the physical design of the 3DIC may be competed.

The flow of FIG. 5 could be modified for steps blue partition 535 and red partition 540 so instead of using a criterion of "minimum connections" to the other partition, other criteria could be used. An example of alternate criteria could be "maximum Blue connection" for step blue partition 535: and "maximum Red connection" for step red partition 540.

It will also be appreciated by persons of ordinary skill in the art that the invention is not limited to what has been particularly shown and described hereinabove. For example, drawings or illustrations may not show all device possibilities for clarity in illustration. Rather, the scope of the invention includes both combinations and sub-combinations of the various features described herein above as well as modifications and variations which would occur to such skilled persons upon reading the foregoing description. Thus the invention is to be limited only by the appended claims.

We claim:

1. A method of designing a 3D Integrated Circuit, the method comprising:
   partitioning at least one design into at least two levels, a first level and a second level,
      wherein said first level comprises a plurality of first transistors,
      wherein said second level comprises a plurality of second transistors, and
      wherein said second level is disposed on top of said first level;
   levels connection pads between said first level and said second level;
   providing placement data of said second level;
   performing placement of said levels connection pads based on said placement data,
   performing a placement of said first level using a placer program executed by a computer,
      wherein said placement of said first level is based on said placement of said levels connection pads,
      wherein said placer is part of a Computer Aided Design (CAD) tool, and
      wherein said first level comprises first routing layers; and
   performing a routing of said first level by routing layers using a router executed by a computer,
      wherein said router is a part of the Computer Aided Design (CAD) tool or a part of another CAD tool, and
      wherein at least one metal routing layer is disposed in-between said plurality of first transistors and said plurality of second transistors.

2. The method according to claim 1, wherein a majority area of said second level comprises memory.

3. The method according to claim 1, wherein results of said second level is a generic structure.

4. The method according to claim 1, wherein said first level is designed to be processed with a different process node than a process node used for said second level.

5. The method according to claim 1, further comprising: performing a routing of said second level by routing layers using a router executed by a computer.

6. The method according to claim 1, wherein said first level comprises Input and Output cells ("IO").

7. The method according to claim 1, wherein said second level comprises one or more RF (Radio Frequency) circuits.

8. A method of designing a 3D Integrated Circuit, the method comprising:
   partitioning at least one design into at least two levels, a first level and a second level,
      wherein said first level comprises a plurality of first transistors,
      wherein said second level comprises a plurality of second transistors,
      wherein said second level is disposed on top of said first level,
   levels connection pads between said first level and said second level;
   providing placement data of said second level;
   performing placement of said levels connection pads based on said placement data,
   performing a placement of said first level using a placer program executed by a computer,
      wherein said placement of said first level is based on said placement of said levels connection pads,
      wherein said placer is part of a Computer Aided Design (CAD) tool, and
      wherein said first level comprises first routing layers; and
   performing a routing of said first level by routing layers using a router executed by a computer,
      wherein said router is a part of the Computer Aided Design (CAD) tool or a part of another CAD tool,
      wherein at least one metal routing layer is disposed in-between said plurality of first transistors and said plurality of second transistors, and
      wherein a majority area of said second level comprises memory.

9. The method according to claim 8, wherein results of said second level is a generic structure.

10. The method according to claim 8, wherein at least one metal routing layer is disposed in-between said plurality of first transistors and said plurality of second transistors.

11. The method according to claim 8, wherein said first level is designed to be processed with a different process node than a process node used for said second level.

12. The method according to claim 8, further comprising: performing a routing of said second level by routing layers using a router executed by a computer.

13. The method according to claim 8, wherein said first level comprises Input and Output cells ("IO").

14. The method according to claim 8, wherein said second level comprises one or more RF (Radio Frequency) circuits.

15. A method of designing a 3D Integrated Circuit, the method comprising:
   partitioning at least one design into at least two levels, a first level and a second level,
      wherein said first level comprises a plurality of first transistors,
      wherein said second level comprises a plurality of second transistors,
      wherein said second level is disposed on top of said first level;

levels connection pads between said first level and said second level;
providing placement data of said second level;
performing placement of said levels connection pads based on said placement data,
performing a placement of said first level using a placer program executed by a computer,
  wherein said placement of said first level is based on said placement of said levels connection pads,
  wherein said placer is part of a Computer Aided Design (CAD) tool, and
  wherein said first level comprises first routing layers; and
performing a routing of said first level by routing layers using a router executed by a computer,
  wherein said router is a part of the Computer Aided Design (CAD) tool or a part of another CAD tool,
  wherein at least one metal routing layer is disposed in-between said plurality of first transistors and said plurality of second transistors, and
  wherein said first level is designed to be processed with a different process node than a process node used for said second level.

16. The method according to claim 15,
wherein a majority area of said first level comprises logic circuits.

17. The method according to claim 15,
wherein results of said second level is a generic structure.

18. The method according to claim 15, further comprising:
providing placement data of said first level; and
performing a placement of said second level using a placer executed by a computer,
  wherein said placement of said second level is based on said placement data.

19. The method according to claim 15,
wherein results of said second level is a generic structure.

20. The method according to claim 15,
wherein said first level comprises Input and Output cells ("IO").

* * * * *